(12) United States Patent
Choi et al.

(10) Patent No.: US 8,482,055 B2
(45) Date of Patent: Jul. 9, 2013

(54) NON-VOLATILE MEMORY DEVICE AND METHOD FOR FABRICATING THE SAME

(75) Inventors: Eun-Seok Choi, Gyeonggi-do (KR); Hyun-Seung Yoo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 39 days.

(21) Appl. No.: 13/304,901

(22) Filed: Nov. 28, 2011

(65) Prior Publication Data
US 2012/0168849 A1   Jul. 5, 2012

(30) Foreign Application Priority Data
Dec. 31, 2010   (KR) .................. 10-2010-0140482

(51) Int. Cl.
*H01L 29/792*   (2006.01)
*H01L 21/336*   (2006.01)
*H01L 29/78*   (2006.01)

(52) U.S. Cl.
USPC .............. 257/324; 257/314; 257/E29.255; 257/E26.309; 257/E21.409; 438/238; 438/268

(58) Field of Classification Search
USPC .......... 257/324, 314, E29.255, E29.309, 257/E21.409; 438/238, 268
See application file for complete search history.

(56) References Cited

FOREIGN PATENT DOCUMENTS

| KR | 1020080079493 | 9/2008 |
|---|---|---|
| KR | 1020090011220 | 2/2009 |
| KR | 1020100116198 | 10/2010 |
| KR | 1020100133671 | 12/2010 |
| KR | 1020110001487 | 1/2011 |
| KR | 1020110013773 | 2/2011 |

OTHER PUBLICATIONS

Notice of Allowance issued by the Korean Intellectual Property Office on Jan. 19, 2012.

*Primary Examiner* — Victor A Mandala
*Assistant Examiner* — Whitney T Moore
(74) *Attorney, Agent, or Firm* — IP & T Group LLP

(57) ABSTRACT

A non-volatile memory device includes a substrate including a resistor layer having a resistance lower than that of a source line, channel structures including a plurality of inter-layer dielectric layers that are alternately staked with a plurality of channel layers over the substrate, and the source line configured to contact sidewalls of the channel layers, where a lower end of the source line contacts the resistor layer.

20 Claims, 17 Drawing Sheets

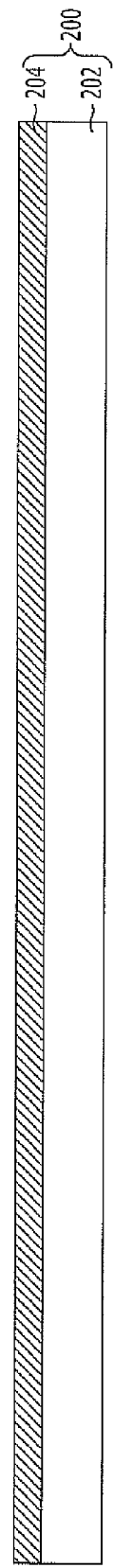

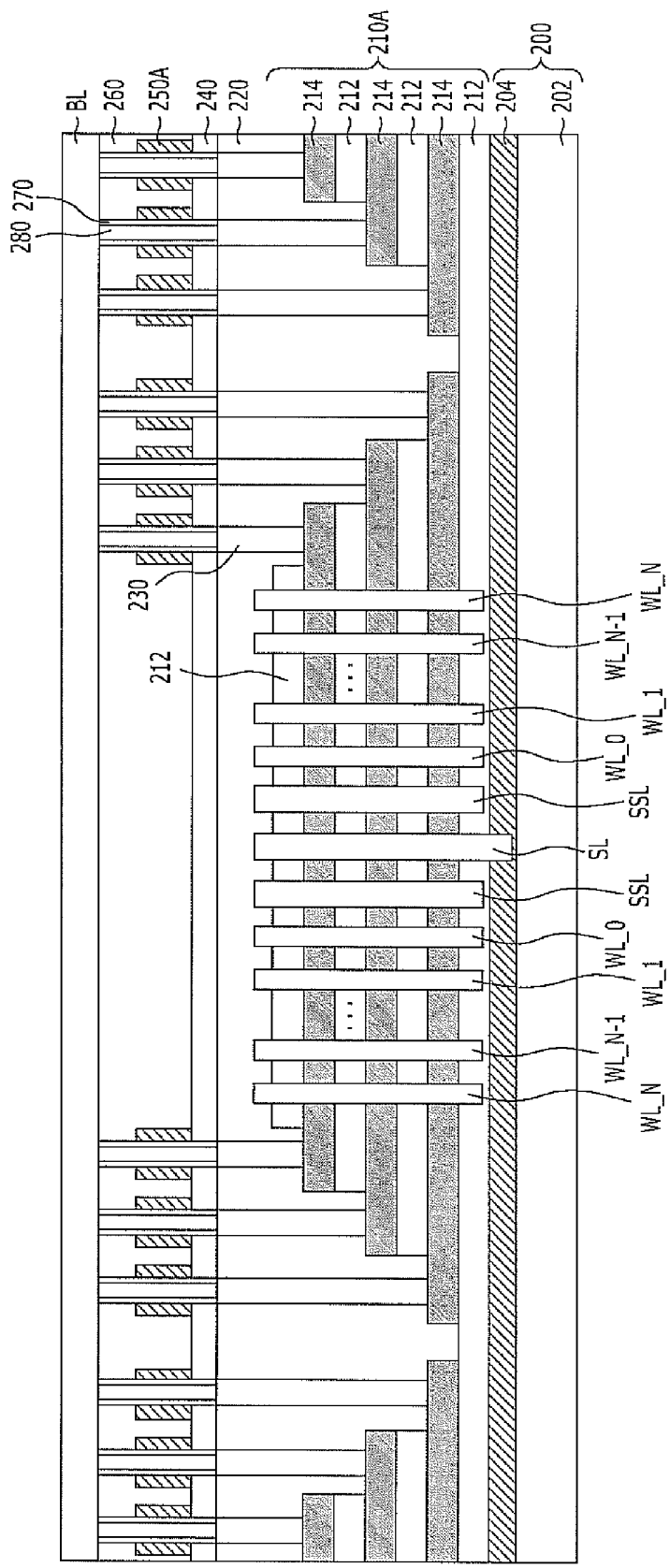

NON-VOLATILE MEMORY DEVICE AND METHOD FOR FABRICATING THE SAME

CROSS-REFERENCE TO RELATED APPLICATIONS

The present application claims priority of Korean Patent Application No. 10-2010-0140482, filed on Dec. 31, 2010, which is incorporated herein by reference in its entirety.

BACKGROUND OF THE INVENTION

Exemplary embodiments of the present invention relate to a non-volatile memory device and a fabrication method thereof, and more particularly, to a non-volatile memory device including a plurality of memory cells being stacked vertically over a substrate and a method for fabricating the same.

A non-volatile memory device retains data stored therein even if power is cut off. There are different types of non-volatile memory devices such as NAND flash memory.

As the integration degree of a two-dimensional memory structure where memory cells are formed in a single layer over a silicon substrate is reaching limits, a three-dimensional non-volatile memory device where a plurality of memory cells are stacked vertically to a silicon substrate are being developed.

Meanwhile, a non-volatile memory device includes a plurality of strings each of which includes a source selection transistor, memory cell transistors, and a drain selection transistor that are coupled serially. One end of each string is coupled with a bit line, and the other end of the string is coupled with one source line in common.

However, as the number of strings coupled with one source line increases, current consumption increases during a read operation. Thus, it is desirable to decrease the resistance of the source line.

SUMMARY OF THE INVENTION

An embodiment of the present invention is directed to a non-volatile memory device that may decrease the resistance of a source line while increasing the integration degree by stacking a plurality of memory cells in a vertical direction, and a method for fabricating the same.

In accordance with an embodiment of the present invention, a non-volatile memory device includes: a substrate including a resistor layer having a resistance lower than that of a source line; channel structures including a plurality of inter-layer dielectric layers that are alternately staked with a plurality of channel layers over the substrate; and the source line configured to contact sidewalls of the channel layers, wherein a lower end of the source line contacts the resistor layer.

In accordance with another embodiment of the present invention, a method for fabricating a non-volatile memory device includes: providing a substrate including a resistor layer having a resistance lower than that of a source line; forming channel structures comprising a plurality of inter-layer dielectric layers that are alternately stacked with a plurality of channel layers over the substrate; and forming the source line contacting sidewalls of the channel layers, wherein a lower end of the source line contacts the resistor layer.

In accordance with yet another embodiment of the present invention, a non-volatile memory device includes: channel structures including a plurality of inter-layer dielectric layers that are alternately stacked with a plurality of channel layers over a substrate; a source line arranged to contact sidewalls of the channel layers; an insulation layer arranged to cover the channel structures; a metal line disposed over the insulation layer; and a contact unit configured to couple the source line with the metal line through the insulation layer.

In accordance with still another embodiment of the present invention, a method for fabricating a non-volatile memory device includes: forming channel structures including a plurality of inter-layer dielectric layers that are alternately stacked with a plurality of channel layers over a substrate; forming a source line contacting sidewalls of the channel layers; forming an insulation layer over the channel structures and the source line; forming a contact unit coupled with the source line through the insulation layer; and forming metal lines coupled with the contact unit over the insulation layer.

BRIEF DESCRIPTION OF THE DRAWINGS

FIGS. 2A to 2E are cross-sectional views illustrating a non-volatile memory device and a fabrication method thereof in accordance with a first embodiment of the present invention.

DESCRIPTION OF SPECIFIC EMBODIMENTS

Figure 1:
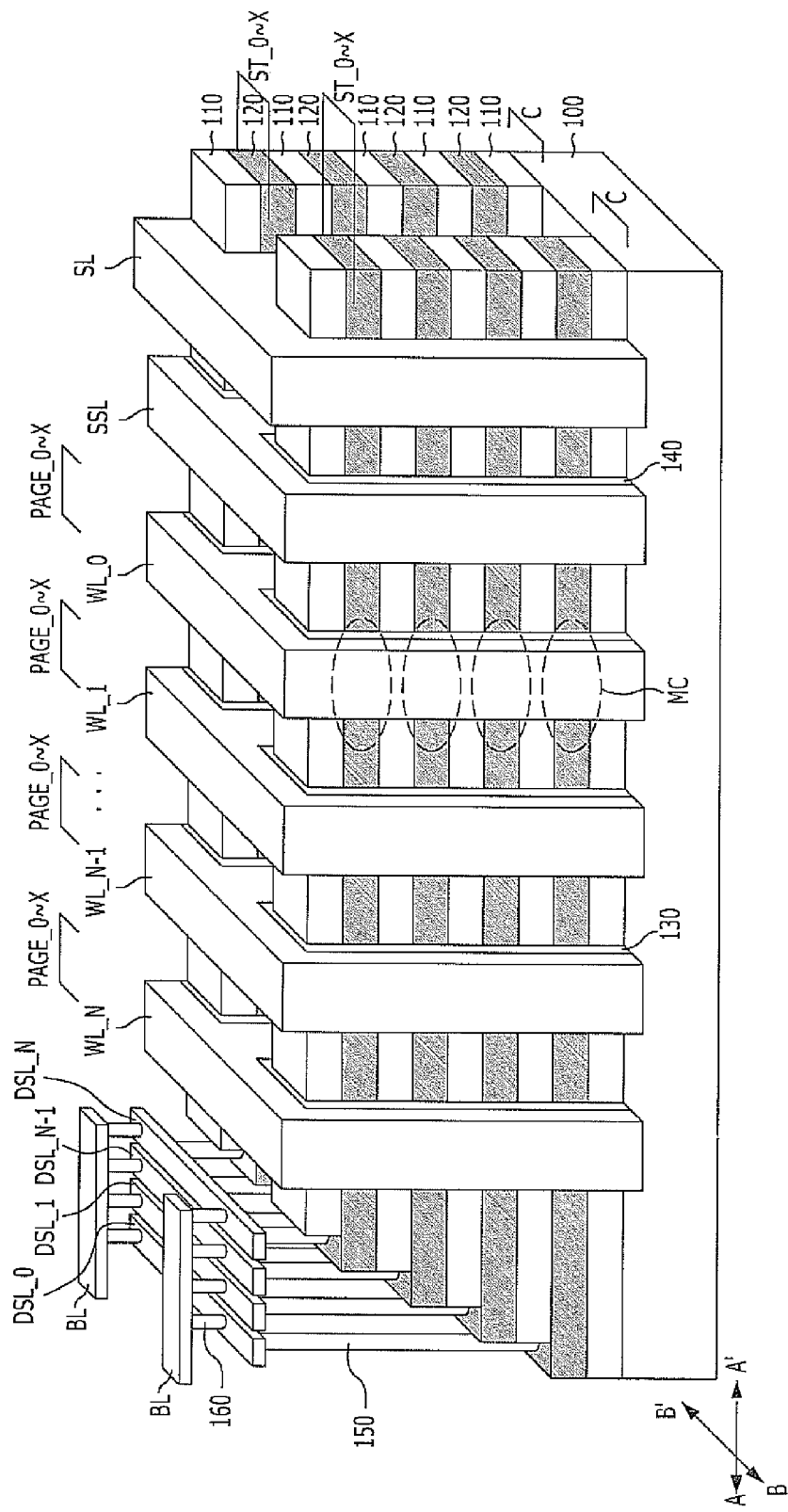
FIG. 1 is a perspective view illustrating a non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereafter, a basic structure of a three-dimensional non-volatile memory device to which the embodiments of the present invention may be applied is briefly described with reference to FIG. 1, and then the embodiments of the present invention will be described with reference to FIGS. 2A to 4E.

FIG. 1 is a perspective view illustrating a non-volatile memory device.

Referring to FIG. 1, the non-volatile memory device includes a substrate 100; channel structures C disposed over the substrate 100 and extended in a first direction, which is a line A-A'; word lines WL_0 to WL_N, a source selection line SSL and a source line SL which contact the sidewalls of the channel structure C by being extended in a second direction, which is a line B-B', crossing the extension direction of the channel structures C, more specifically, which contact the sidewalls of a plurality of channel layers 120 which are included by the channel structures C; drain selection lines DSL_0 to DSL_N which are disposed over the staircase portion of the channel structures C and extended in the second direction; and bit lines BL which are disposed over the drain selection lines DSL_0 to DSL_N and extended in the first direction.

The substrate 100 may be a single-crystalline silicon substrate and may include a desired structure (not shown) such as wells or an insulation layer.

The channel structures C may include inter-layer dielectric layers 110 and channel layers 120 that are alternately stacked. The inter-layer dielectric layers 110 may include an oxide layer or a nitride layer. The channel layers 120 may be polysilicon layers or single-crystalline silicon layers doped with a P-type or N-type dopant. A plurality of channel structures C may be disposed to be extended in the first direction. The channel structures C may be arranged in parallel to each other with a space between them in the second direction. The end of the channel structures C may have a staircase shape as shown along the A-A' direction.

A plurality of word lines WL_0 to WL_N may be disposed by being extended in the second direction. Each of the word lines WL_0 to WL_N includes a portion which is disposed over the channel structure C and extended in the second direction, and a portion which protrudes vertically down from the extended portion to fill the space between the channel structures C, which are disposed with the space between them extending in the second direction. Accordingly, the protruding portion contacts the sidewalls of the channel structures C with a memory layer 130, which is to be described later, between them, more specifically, on the vertically extending sidewalls. The word lines WL_0 to WL_N may include a conductive material, such as a metal material or a semiconductor material, e.g., polysilicon doped with an impurity.

The memory layer 130 may be interposed between the word lines WL_0 to WL_N and the channel structures C, and the memory layer 130 electrically insulates the word lines WL_0 to WL_N and the channel structures C from each other and substantially functions as a data storage layer by trapping charges. The memory layer 130 may be of triple layers including a tunnel insulation layer, a charge is trapping layer, and a charge blocking layer. The tunnel insulation layer is disposed adjacent to the channel structures C and it may be an oxide layer. The charge blocking layer is disposed adjacent to the word lines WL_0 to WL_N and it may be an oxide layer. The charge trapping layer is disposed between the tunnel insulation layer and the charge blocking layer, and it may be a nitride layer.

The source selection line SSL is disposed on one side of the word lines WL_0 to WL_N has a top portion extended in the second direction in parallel to the top potions of word lines WL_0 to WL_N. As a result, the source selection line SSL is disposed between the word lines WL_0 to WL_N and the source line SL. Just like the word lines WL_0 to WL_N, the source selection line SSL may include a portion which is disposed over the channel structure C and extended vertically and a portion which protrudes vertically down from the extended portion to fill the space between the channel structures C, which are arranged in the second direction with the space between them. Accordingly, the protruding portion contacts the sidewalls of the channel structures C with a gate insulation layer 140, which is to be described later, between them, more specifically, on the vertically extending sidewalls. The source selection line SSL may include a conductive material, such as a metal material or a semiconductor material, e.g., polysilicon doped with an impurity.

The gate insulation layer 140 may be interposed between the source selection line SSL and the channel structures C.

Figure 5A:
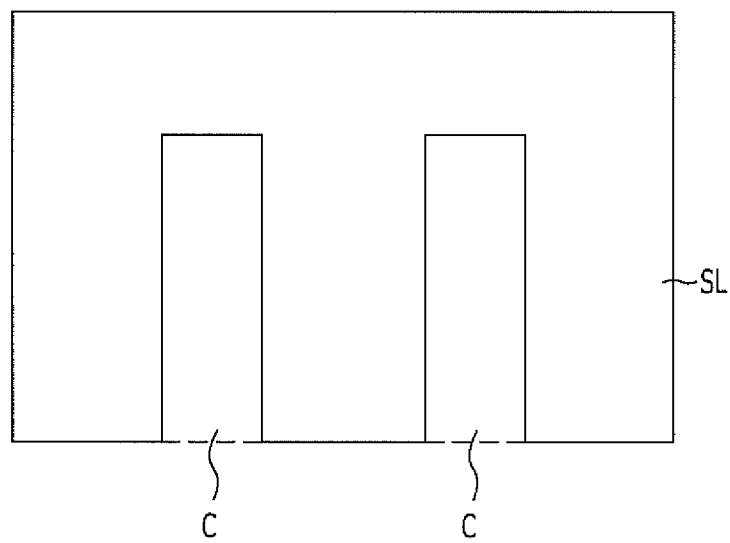
FIGS. 5A and 5B are cross-sectional views of the source line SL taken along the A-A' direction shown in FIG. 1.
Figure 5B:
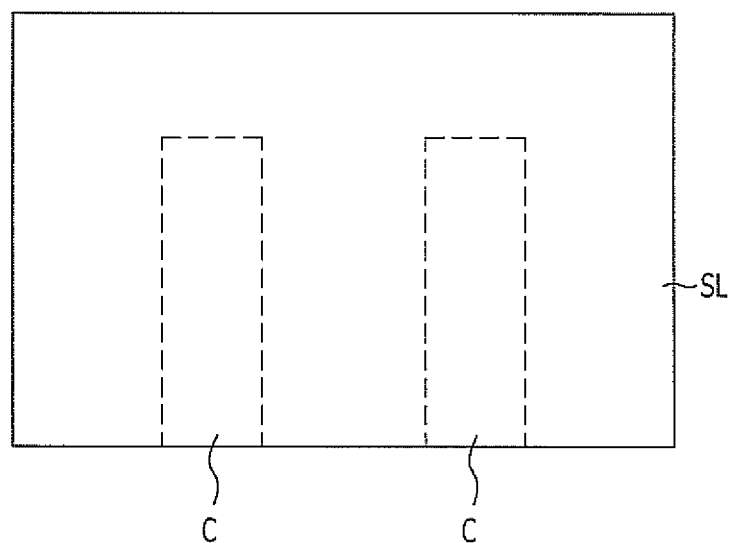

The source line SL may be disposed on one side of the source selection line SSL with the top portion of the source line SL extending in the second direction in parallel to the top portion of the source selection line SSL. FIGS. 5A and 5B exemplarily show a shape of the source line SL, where FIGS. 5A and 5B are cross-sectional views of the source line SL taken in the B-B' direction. For illustration purposes, the bottom outlines of the channel structures C are illustrated in a dotted line.

Referring to FIG. 5A, the source line SL may have substantially the same shape as that of the word lines WL_0 to WL_N or the source selection line SSL. Here, the source line SL may have a portion which is disposed over the channel structure C and extended in the second direction, and a portion which protrudes vertically down from the extended portion to fill the space between the channel structures C, which are arranged in the second direction with the space between them. Accordingly, the protruding portion contacts the sidewalls of the channel structures C, more specifically, the vertical sidewalls.

Referring to FIG. 5B, the source line SL may have a different shape from the shape of the word lines WL_0 to WL_N or the source selection line SSL. Here, the source line SL may be extended in the second direction while penetrating the channel structures C to contact the sidewalls of the channel structures C, particularly, the sidewalls of the second direction. The source line SL may include a conductive material, for example, a semiconductor material, e.g., polysilicon doped with an impurity.

The drain selection lines DSL_0 to DSL_N are disposed over the staircase portion of the channel structures C and extended in the second direction to thereby couple to drain selection transistors (not shown) arranged in the second direction with respect to each other. More specifically, a plurality of channel contacts 150 arranged in the second direction are formed over the protruding end of each channel layer 120, and channels 160 for the drain selection transistors are disposed over the channel contacts 150, respectively. The drain selection lines DSL_0 to DSL_N are extended in the second direction and surrounds the channels 160 for the drain selection transistors.

The bit lines BL are disposed over the drain selection lines DSL_0 to DSL_N and coupled with the channels 160 for the drain selection transistors that are arranged in the first direction by being extended in the first direction. In the drawings, although the bit lines BL are illustrated to be disposed only over the staircase portion of the channel structures C, the bit lines BL may be further extended in the first direction and go across the upper portions of the word lines WL, the source selection line SSL, and the source line SL.

Although not illustrated in the drawings, the constituent elements disposed on the left side of the source line SL may be symmetrically disposed on the right side of the source line SL.

In the non-volatile memory device described in the above, a plurality of memory cells MC are disposed. Here, the memory cells MC each includes a channel layer 120, a memory layer 130 contacting the channel layer 120, and a portion of word lines WL_0 to WL_N contacting the channel layer 120 through the memory layer. The number of memory cells MC that are stacked equal the number of layers of the channel layers 120 in the vertical direction, and in the horizontal direction, the memory cells MC may be arranged in the form of matrix along the first direction and the second direction.

Herein, the memory cells MC which are arranged in the first direction in the same layer and share the same channel layer 120 constitute one string ST, and a stacked string ST_0 to X having a number of layers equal to the number of the channel layers 120 is disposed for each channel structure C. Stacked strings ST_0 to X sharing the same channel structure C are coupled with the same bit line BL. Also, stacked strings ST_0 to X coupled with multiple bit lines BL are coupled in common with one source line SL.

Also, a plurality of memory cells MC which are arranged in the same layer in the second direction and share the same word line WL, that is, any one among the word lines WL_0 to WL_N, constitute one page PAGE. A stacked page PAGE_0 to X including a number of pages stacked equal to the number of the channel layers 120 is disposed for one word line WL. A target page PAGE among the pages of the stacked page PAGE_0 to X sharing one word line WL may be selected by the drain selection lines DSL_0 to X.

The non-volatile memory device having the above-described structure may perform a read operation or a write operation in such a manner of selecting a target page PAGE by controlling the word lines WL_0 to WL_N and the bit lines BL in a reasonably suitable method and particularly using the multiple drain selection lines DSL_0 to X. In other words, the target page PAGE may be selected by activating a drain selection line DSL coupled with the target page PAGE during the read or write operation and inactivating the other drain selection lines DSLs.

According to the three-dimensional non-volatile memory device described above, stacked strings ST_0 to X coupled with multiple bit lines BL are coupled in common with one source line SL. Here, it is a structure where one source line SL is coupled with a plurality of strings ST. Here, it is desirable to reduce the resistance of the source line SL. A structure that may reduce the resistance of the source line SL is described below with reference to FIGS. 2A to 4E.

Figure 2B:
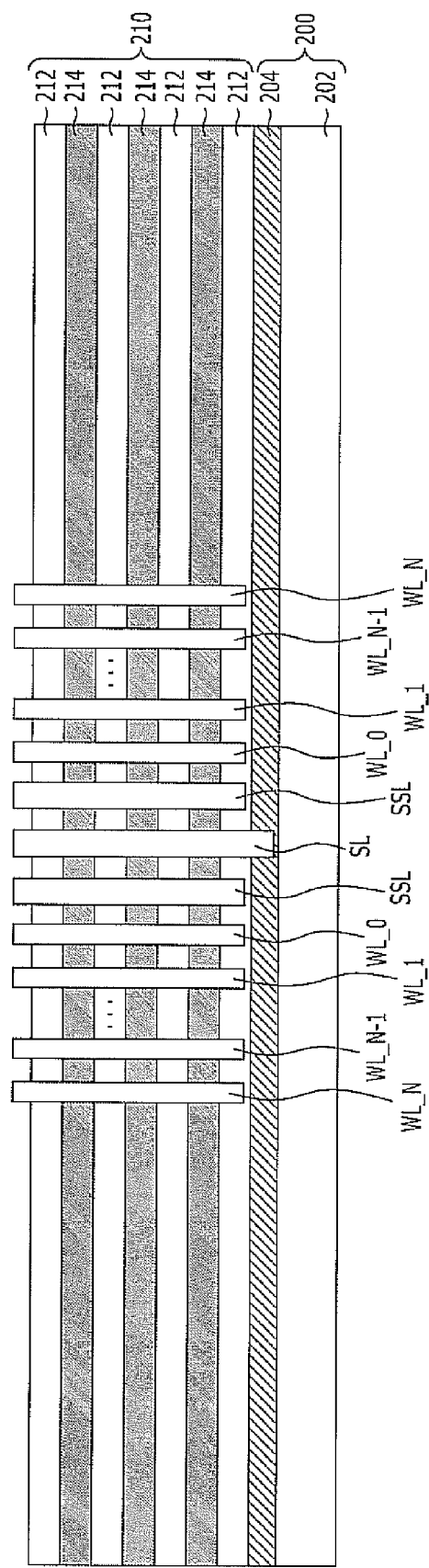

FIGS. 2A to 2E are cross-sectional views illustrating a non-volatile memory device and a fabrication method thereof in accordance with a first embodiment of the present invention. Particularly, FIG. 2E shows the non-volatile memory device in accordance with the first embodiment of the present invention, and FIGS. 2A to 2D illustrate intermediate processes for fabricating the non-volatile memory device shown in FIG. 2E. The drawings show cross-sections taken along a line A-A' in FIG. 1. Hereafter, description as to the same constituent elements as those of the non-volatile memory device shown in FIG. 1 is omitted or provided briefly, and the description is provided based on the modifications from the non-volatile memory device of FIG. 1.

First, the non-volatile memory device is described.

Referring to FIG. 2E, the non-volatile memory device in accordance with the first embodiment of the present invention includes a substrate 200, channel structures 210A, a source line SL, source selection lines SSL, and a plurality of word lines WL_0 to WL_N. The substrate 200 includes low-resistance resistors 204 having a lower resistance than the source line SL. The channel structure 210A is extended in a first direction and includes inter-layer dielectric layers 212 and channel layers 214 that are stacked alternately over the substrate 200. The source line SL is extended in a second direction while contacting the sidewall of the channel structure 210A and the lower end of the source line SL contacts the low-resistance resistors 204. The source selection lines SSL is symmetrically disposed on both sides of the source line SL and extended in the second direction while contacting the sidewall of the channel structure 210A with a gate insulation layer 140 (see FIG. 1) between them. The word lines WL_0 to WL_N are symmetrically disposed on both sides of the source selection lines SSL and extended in the second direction while contacting the sidewall of the channel structure 210A with a memory layer 130 (see FIG. 1) between them.

The substrate 200 may be a semiconductor substrate such as a silicon substrate.

The low-resistance resistors 204 may be formed at the regions doped with an impurity and having a desired depth from the surface of the substrate 200. For example, the low-resistance resistors 204 may be the regions doped with a high-concentration N-type impurity. For illustration purposes, a portion of the substrate 200 under the low-resistance resistors 204 is referred to as a support portion 202 hereafter. Although not illustrated in the drawings, the support portion 202 may include an insulation layer in the uppermost portion.

Also, the low-resistance resistors 204 may be a semiconductor layer, such as a polysilicon layer, doped with a high-concentration impurity, a metal layer, or a metal silicide layer disposed over the support portion 202. Examples of the metal layer include a tungsten layer, a platinum layer, a ruthenium layer, and an iridium layer. Examples of the metal silicide layer include a titanium silicide layer and a tungsten silicide layer.

Channel structures 210A may be substantially the same as the channel structures C shown in FIG. 1. Here, the channel structures 210A may be arranged in parallel to each other in the second direction by being extended in the first direction and may have both ends formed in a staircase shape, except the region where the word lines WL_0 to WL_N, the source selection lines SSL, and the source line SL are disposed. Here, both ends of the channel structure 210A having the shape of staircase means that multiple channel layers 214 protrude more in the first direction than their upper channel layer 214.

The source line SL is similar to the source line SL shown in FIG. 1 but the difference is that the lower end of the source line SL contacts the low-resistance resistors 204 in the upper portion of the substrate 200. Here, the source line SL may have a portion disposed over the channel structures 210A and extended in the second direction and a portion vertically protruding down from the extended portion to fill the space between the channel structures 210A, which are arranged in the second direction with a space between them. Here, the protruding portion has a height sufficient for contacting the low-resistance resistors 204 in the upper portion of the substrate 200. Also, the source line SL may penetrate the channel structure 210A and be extended in the second direction. Here, the source line SL has a height sufficient for contacting the low-resistance resistors 204 in the upper portion of the substrate 200.

The word lines WL_0 to WL_N and the source selection lines SSL may have substantially the same shape as the word lines WL_0 to WL_N and the source selection lines SSL that are shown in FIG. 1. Accordingly, the word lines WL_0 to WL_N and the source selection lines SSL include a portion which is disposed over the channel structure 210A and extended in the second direction, and a portion which protrudes vertically from the extended portion to fill the space between the channel structures 210A, which are arranged in the second direction with the space between them. Here, the height of the protruding portion is such that it does not contact the low-resistance resistors 204 in the upper portion of the substrate 200 but contacts the sidewalls of all the channel layers 214.

Furthermore, the non-volatile memory device in accordance with the first embodiment of the present invention may further include channel contacts 230, drain selection lines 250A, channels 280 for drain selection transistors, and bit lines BL, which are substantially the same as those illustrated in FIG. 1. In other words, the channel contacts 230 are formed over the staircase portion of the channel structures 210A. More specifically, the channel contacts 230 are formed over the protruding ends of the channel layers 214. The channels 280 for drain selection transistors and a gate insulation layer 270 of the drain selection transistors surrounding the channels 280 are disposed over the channel contacts 230. The drain selection lines 250A are extended in the second direction while surrounding the channels 280 and the gate insulation layer 270 to couple the drain selection transistors arranged with each other in the second direction. The bit lines BL are extended in the first direction while contacting the channels 280 over the channels 280 and coupled with the channels 280 arranged in the first direction.

Reference numerals '220', '240' and '260' which are not described above denote a first insulation layer, a second insulation layer, and a third insulation layer.

Hereafter, a method for fabricating the non-volatile memory device is described.

Referring to FIG. 2A, a substrate 200 including low-resistance resistors 204 in the upper portion is provided.

Low-resistance resistors 204 may be formed by doping the substrate 200, which is formed of a semiconductor material such as silicon, with a high-concentration impurity, such as an N-type impurity.

Also, the low-resistance resistors 204 may be formed by depositing a semiconductor layer, such as a polysilicon layer, doped with a high-concentration impurity, a metal layer, or a metal silicide layer over a support portion 202 of the substrate 200. Examples of the metal layer include a tungsten layer, a platinum layer, a ruthenium layer, and an iridium layer. Examples of the metal silicide layer include a titanium silicide layer and a tungsten silicide layer.

Referring to FIG. 2B, a plurality of channel structures 210 extended in the first direction and arranged in the second direction in parallel to each other with a desired spacing between them are formed by alternately forming inter-layer dielectric layers 212 and channel layers 214 over the substrate 200 including the low-resistance resistors 204 and patterning the inter-layer dielectric layers 212 and the channel layers 214.

Subsequently, a plurality of word lines WL_0 to WL_N and source selection lines SSL are formed. The word lines WL_0 to WL_N and the source selection lines SSL may be formed to be symmetrically disposed on both sides of a source line SL. Also, the word lines WL_0 to WL_N and the source selection lines SSL are formed in such as manner that their lower portions do not contact the low-resistance resistors 204 of the substrate 200. Hereafter, a method for forming the word lines WL_0 to WL_N and the source selection lines SSL is described in detail.

For example, after an insulation layer (not shown) covering the channel structures 210 is formed, trenches (not shown) for defining spaces where the word lines WL_0 to WL_N and the source selection lines SSL are to be formed are formed by selectively etching the insulation layer. Here, the insulation layer is etched to a depth exposing the sidewalls of all the channel layers 214 while not exposing the low-resistance resistors 204. Subsequently, a memory layer 130 (see FIG. 1) is formed within the trenches for forming the word lines WL_0 to WL_N, and a gate insulation layer 140 (see FIG. 1) is formed within the trenches for forming the source selection lines SSL. Subsequently, the word lines WL_0 to WL_N and the source selection lines SSL may be formed by filling the trenches with a conductive material.

Subsequently, a source line SL is formed. The source line SL is formed in such a manner than the lower end of the source line SL contacts the low-resistance resistors 204 of the substrate 200. Hereafter, a method for forming the source line SL is described in detail.

For example, a trench (not shown) for defining a space where the source line SL is to be formed may be formed by selectively etching the insulation layer (not shown) between the source selection lines SSL. Here, the insulation layer (not shown) is etched to a depth exposing the sidewalls of all the channel layers 214 while exposing the low-resistance resistors 204 as well. Subsequently, the source line SL may be formed by filling the trench with a conductive material.

Alternatively, a line-type trench (not shown), which is extended in the second direction and penetrates the channel structures 210 while exposing the low-resistance resistors 204 may be formed by selectively etching the insulation layer (not shown) between the source selection lines SSL and the channel structures 210 and exposing the low-resistance resistors 204. Subsequently, the source line SL may be formed by filling the trench with a conductive material.

Figure 2C:
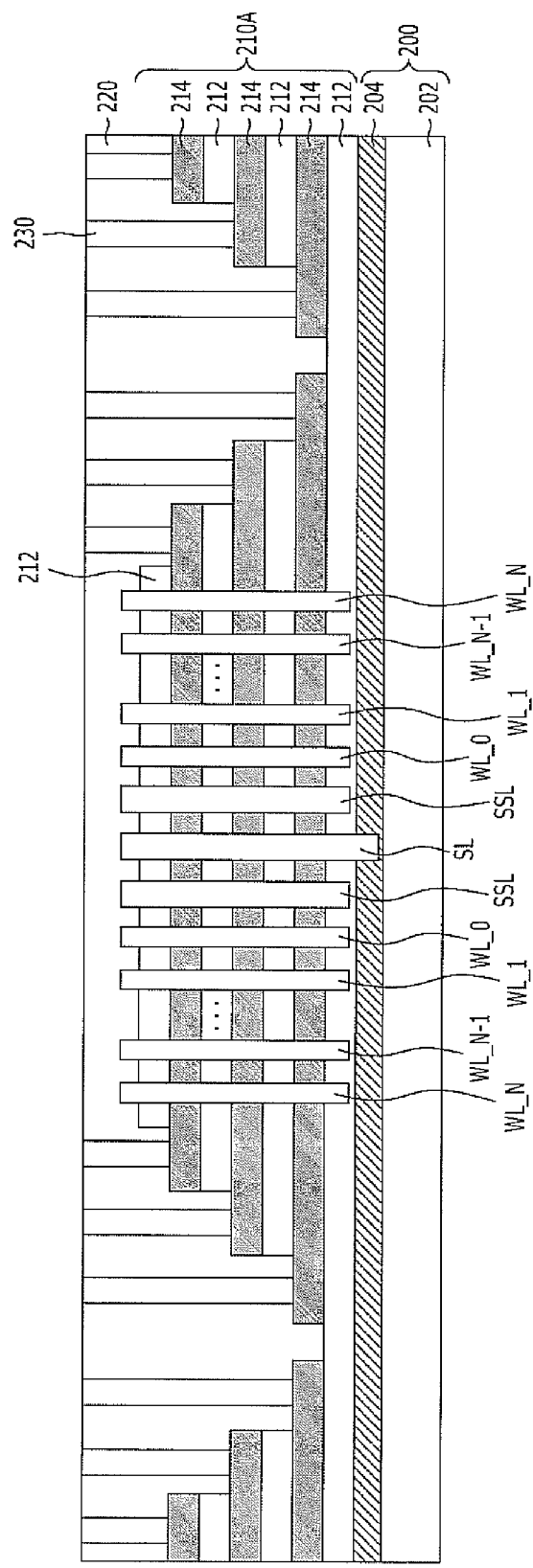

Referring to FIG. 2C, channel structures 210A with both ends shaped like a staircase are formed by etching the channel structures 210 of a region except a region where the word lines WL_0 to WL_N, the source selection lines SSL, and the source line SL are disposed. Since the etching method for forming the channel structures 210A having a staircase shape is well-known in the art, further description thereof not provided herein.

Subsequently, a first insulation layer 220 covering the resultant structure is formed. The first insulation layer 220 of the regions corresponding to both ends of the channel structures 210A is selectively etched to form contact holes which expose the protruding ends of the channel layers 214. Subsequently, channel contacts 230 coupled with the channel layers 214 are formed by filling the contact holes with a conductive material.

Figure 2D:
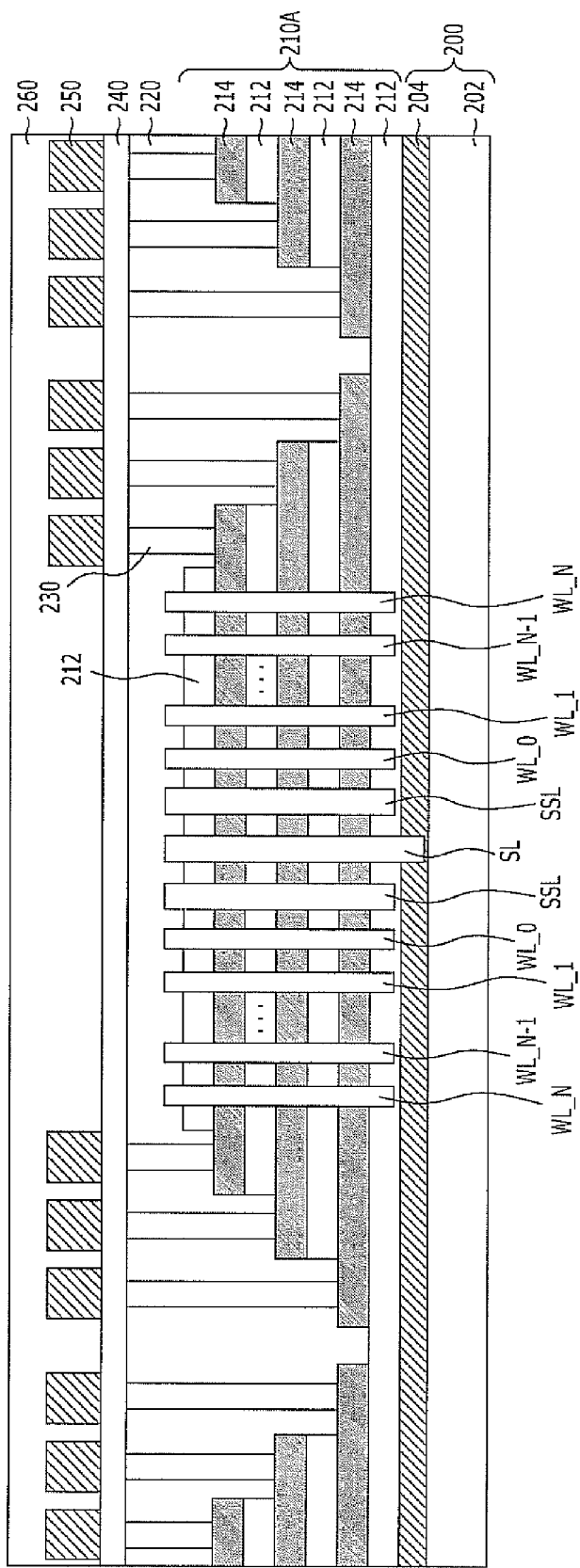

Referring to FIG. 2D, a second insulation layer 240 is formed over the first insulation layer 220 including the channel contacts 230, and a conductive layer 250 for drain selection lines is formed over the second insulation layer 240. Here, the conductive layer 250 is formed over the channel contacts 230 and has a shape of line extended in the second direction.

Subsequently, a third insulation layer 260 covering the conductive layer 250 for drain selection lines is formed.

Referring to FIG. 2E, contact holes which expose the channel contacts 230 are formed by selectively etching the third insulation layer 260, the conductive layer 250 for drain selection lines, and the second insulation layer 240. Subsequently, gate insulation layers 270 for drain selection transistors on the sidewalls of each contact hole are formed, and then channels 280 for drain selection transistors are formed by filling the contact holes including the gate insulation layer 270 with a channel-forming layer, for example, a semiconductor material. The etched conductive layer 250 for drain selection transistors becomes drain selection lines 250A.

Subsequently, bit lines BL extended in the first direction and coupled with the channels 280 for drain selection transistors that are arranged in the first direction are formed by depositing a conductive layer over the third insulation layer 260 and patterning the deposited conductive layer.

Figure 3A:
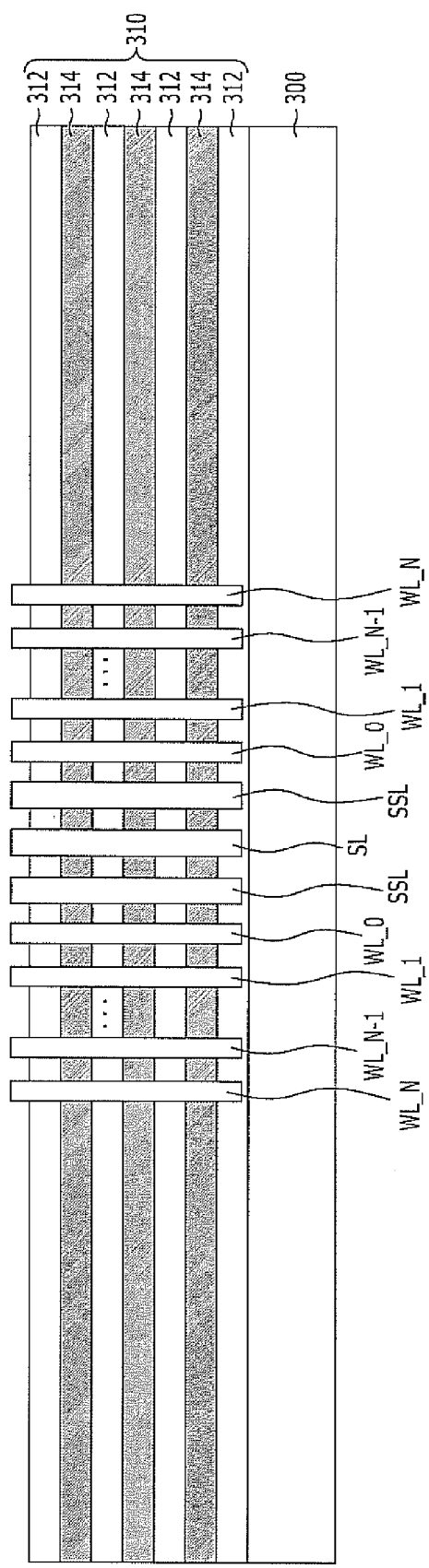
FIGS. 3A to 3E are cross-sectional views illustrating a non-volatile memory device and a fabrication method thereof in accordance with a second embodiment of the present invention.
Figure 3B:
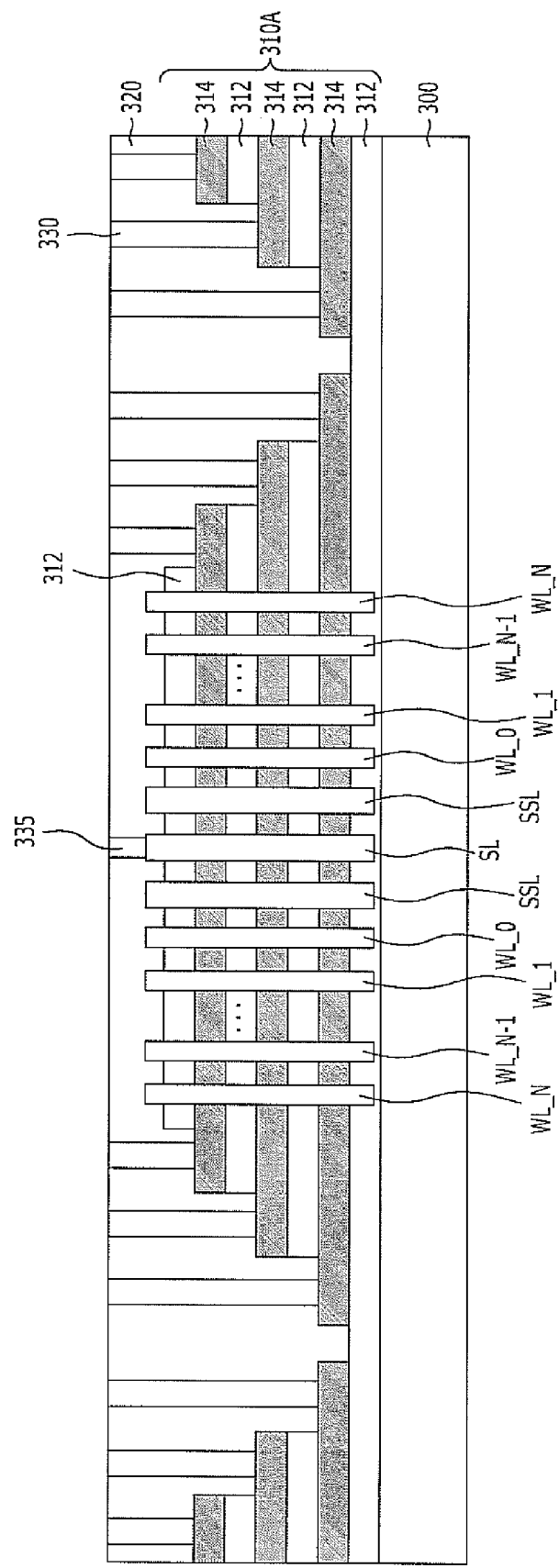
Figure 3C:
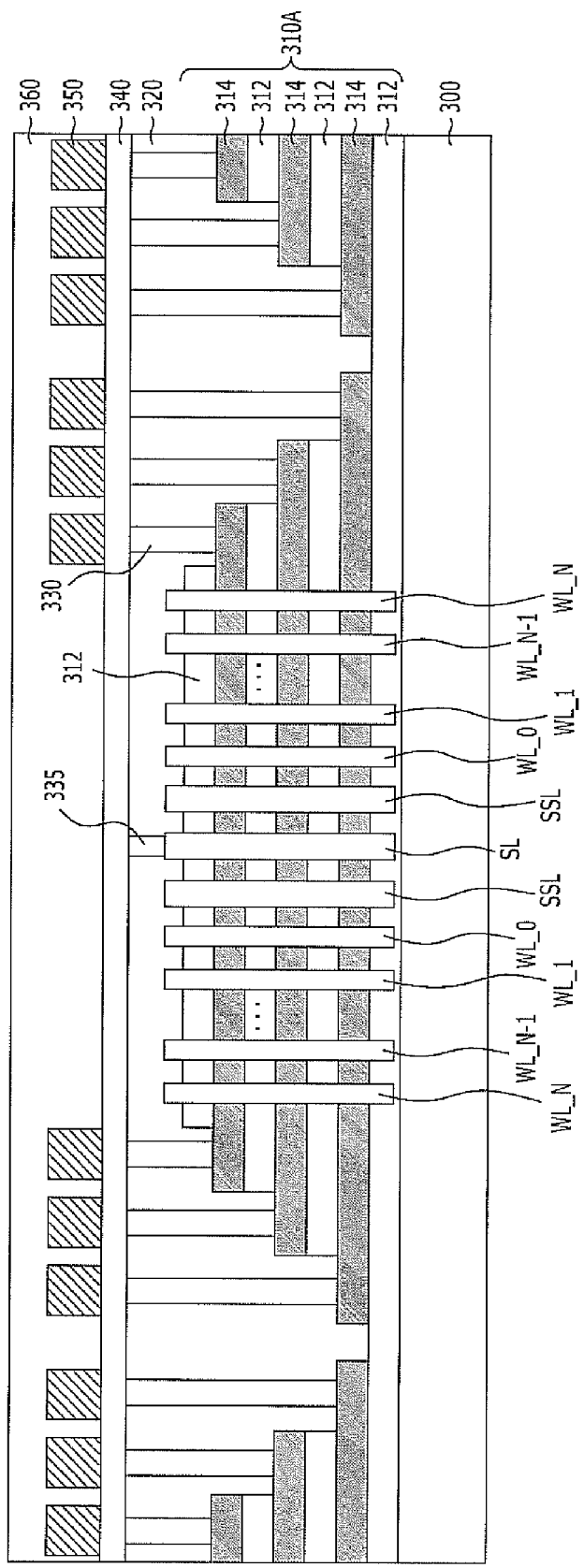
Figure 3D:
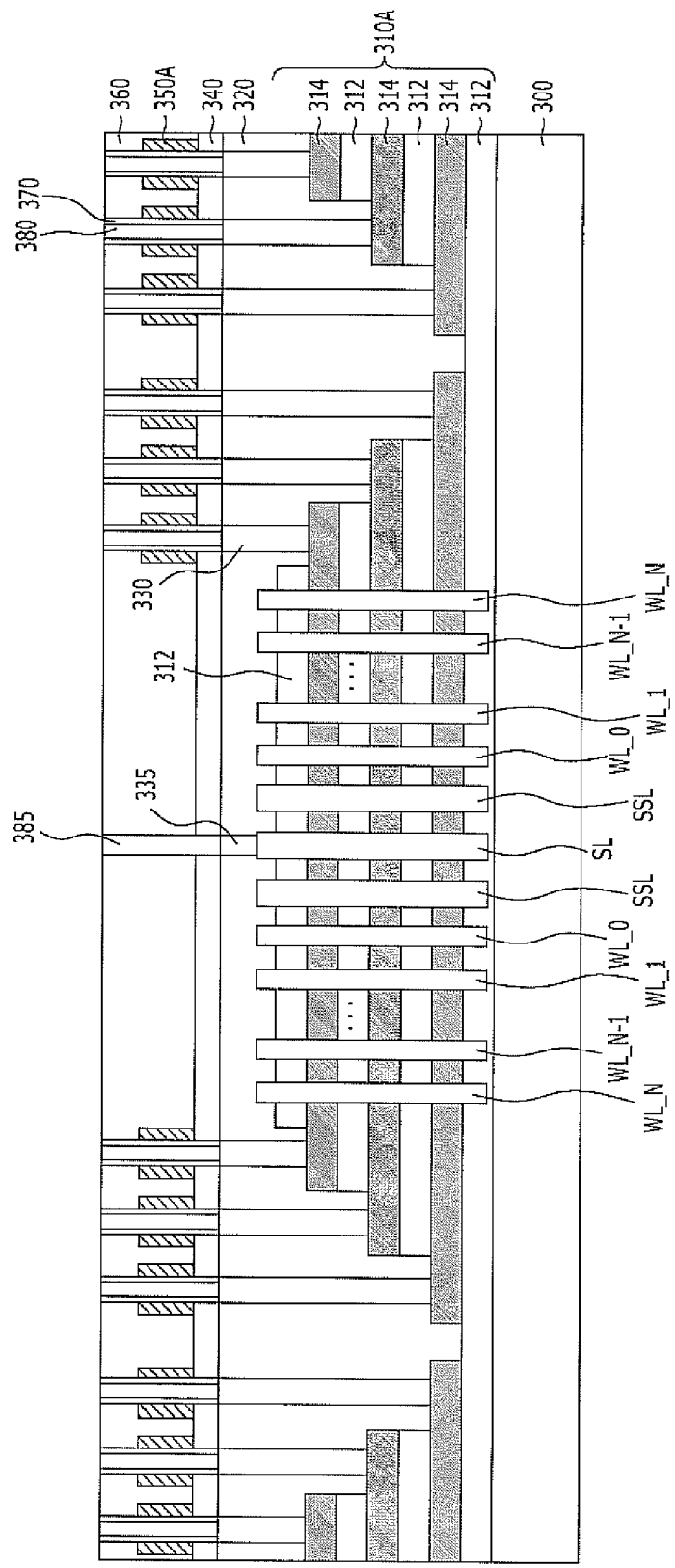
Figure 3E:
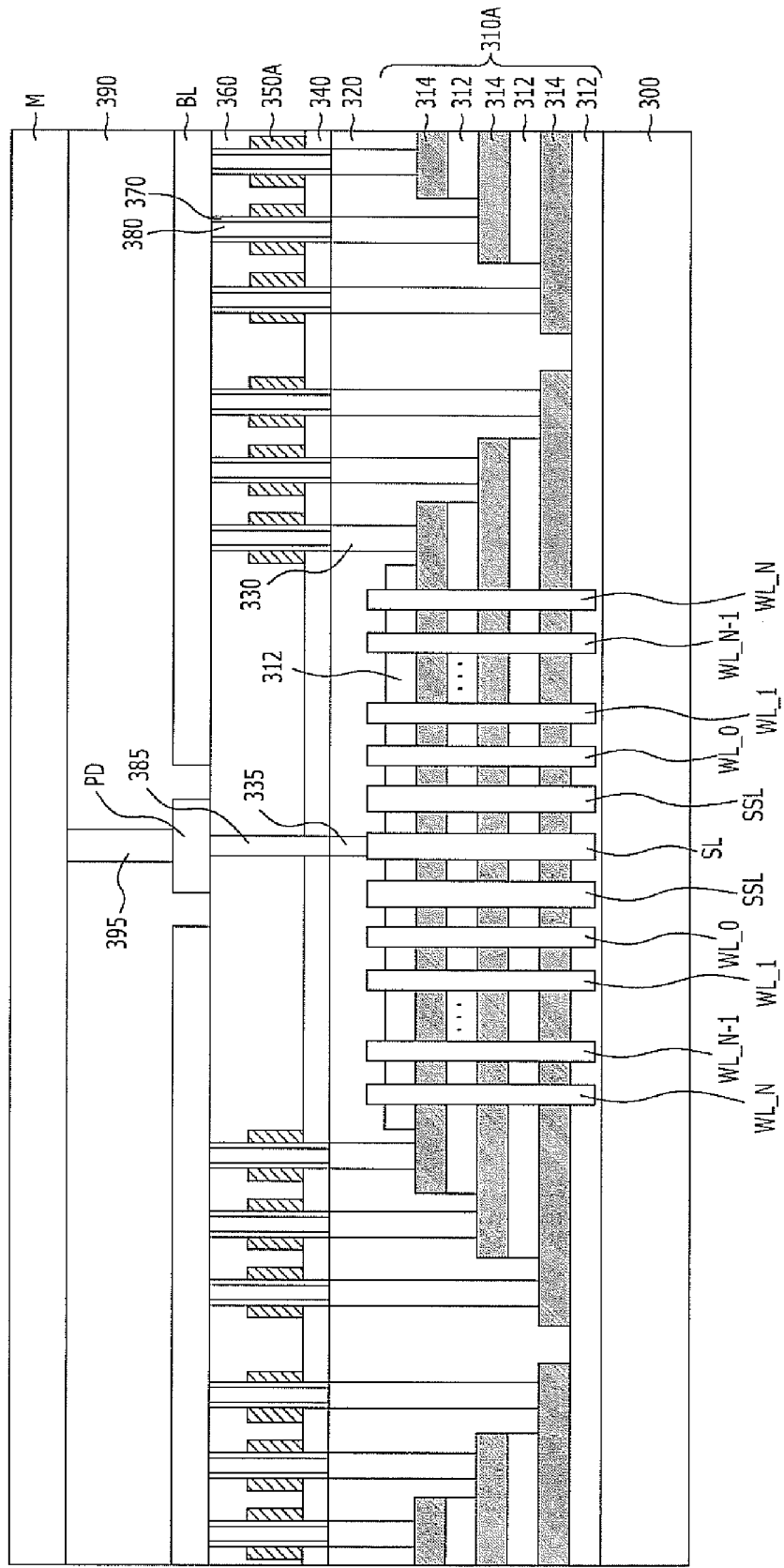

FIGS. 3A to 3E are cross-sectional views illustrating a non-volatile memory device and a fabrication method thereof in accordance with a second embodiment of the present invention. Particularly, FIG. 3E shows the non-volatile memory device in accordance with the second embodiment of the present invention, and FIGS. 3A to 3D illustrate intermediate processes for fabricating the non-volatile memory device shown in FIG. 3E. The drawings show cross-sections taken along a line A-A' in FIG. 1. Hereafter, description as to the same constituent elements as those of the non-volatile memory device shown in FIG. 1 is omitted or provided briefly, and the description is directed to differences/modifications from the non-volatile memory device of FIG. 1.

First, the non-volatile memory device is described.

Referring to FIG. 3E, the non-volatile memory device in accordance with the second embodiment of the present invention includes a substrate 300, channel structures 310A, a source line SL, source selection lines SSL, a plurality of word lines WL_0 to WL_N, metal lines M, and contacts 335, 385, PD and 395. Each channel structures 310A is extended in a first direction and includes inter-layer dielectric layers 312 and channel layers 314 that are stacked alternately over the substrate 300. The source line SL is extended in a second direction and contacts the sidewalls of the channel structures 310A. The source selection lines SSL are symmetrically disposed on both sides of the source line SL and extended in the second direction and contact the sidewalls of the channels structure 310A with a gate insulation layer 140 (see FIG. 1) between them. The word lines WL_0 to WL_N are symmetrically disposed on both sides of the source selection lines SSL and extended in the second direction and contact the sidewalls of the channel structures 310A with a memory layer 130 (see FIG. 1) between them. The metal lines M are disposed over insulation layers 320, 340, 360 and 390. The contacts 335, 385, PD and 395 electrically connect the metal lines M and the source line SL through the insulation layers 320, 340, 360 and 390.

The substrate 300 may be a semiconductor substrate such as a silicon substrate.

Channel structures 310A may be substantially the same as the channel structures C shown in FIG. 1. Here, the channel structures 310A may be arranged in parallel to each other in the second direction by being extended in the first direction and may have both ends formed in a staircase shape, except the region where the word lines WL_0 to WL_N, the source selection lines SSL, and the source line SL are disposed.

The source line SL may be substantially the same as the source line SL shown in FIG. 1. Here, the source line SL may have a portion disposed over the channel structures 310A and extended in the second direction and a portion vertically protruding down from the extended portion to fill the space between the channel structures 310A, which are arranged in the second direction by with a space between them. Alternatively, the source line SL may penetrate the channel structures 310A and be extended in the second direction.

The word lines WL_0 to WL_N and the source selection lines SSL may have substantially the same shape as the word lines WL_0 to WL_N and the source selection lines SSL that are shown in FIG. 1. Accordingly, the word lines WL_0 to WL_N and the source selection lines SSL include a portion which is disposed over the channel structure 310A and extended in the second direction, and a portion which protrudes vertically from the extended portion to fill the space between the channel structures 310A, which are arranged in the second direction with the space between them.

First to fourth insulation layers 320, 340, 360 and 390 are sequentially stacked over the channel structure 310A, and the metal lines M is disposed over the fourth insulation layer 390.

Within the first insulation layer 320, channel contacts 330 coupled with the staircase portion of the channel structures 310A, which is the protruding ends of the channel layers 314, through the first insulation layer 320 and a first contact 335 coupled with the upper end of the source line SL through the first insulation layer 320 are disposed. The channel contacts 330 are substantially the same as those of FIG. 1.

Within the second and third insulation layers 340 and 360, channels 380 for drain selection transistors coupled with the channel contacts 330 through the second and third insulation layers 340 and 360 and a gate insulation layer 370 surrounding the channels 380 are disposed. Over the second insulation layer 340, drain selection lines 350A are disposed. The drain selection lines 350A are extended in the second direction while surrounding the channels 380 for drain selection transistors and the gate insulation layer 370 and couple the drain selection transistors that are arranged in the second direction with each other. Also, within the second and third insulation layers 340 and 360, a second contact 385 is disposed penetrating the second and third insulation layers 340 and 360 to be coupled with the first contact 335. The channels 380 for drain selection transistors, the gate insulation layer 370, and the drain selection lines 350A are substantially the same as those shown in FIG. 1.

Over the third insulation layer 360, bit lines BL that are extended in the first direction while contacting the channels 380 and coupled with the channels 380 arranged in the first direction, and a pad PD coupled with the second contact 385 are disposed. Here, while being extended in the first direction, the bit lines BL are cut off in the middle area so that the bit lines BL do not exist in the area where the pad PD is disposed, and the pad PD exists in the area between the segments of each bit line BL. The pad PD, which will be described later, may be formed together in the course of forming the bit lines BL. Accordingly, the pad PD may be formed in the same layer as the layer for bit lines BL. The bit lines BL are substantially the same as those shown in FIG. 1, except that the bit lines BL are cut so that they do not exist over the source line SL.

Within the fourth insulation layer 390 covering the bit lines BL and the pad PD, a third contact 395 coupled with the pad PD through the fourth insulation layer 390 is disposed.

The metal lines M coupled with the third contact 395 are disposed over the fourth insulation layer 390.

Here, according to the embodiment of the present invention, the source line SL may be electrically connected to the metal lines M by the first contact 335, the second contact 385, the pad PD and the third contact 395 through the first to fourth insulation layers 320, 340, 360 and 390. Accordingly, the resistance of the source line SL may be reduced.

Hereafter, a method for fabricating the non-volatile memory device is described.

Referring to FIG. 3A, a plurality of channel structures 310 are formed to be extended in the first direction and are arranged in parallel to each other in the second direction with a desired spacing between them by alternately forming inter-layer insulation layers 312 and channel layers 314 over the substrate 300 and patterning the inter-layer insulation layers 312 and the channel layers 314.

Subsequently, a plurality of word lines WL_0 to WL_N and source selection lines SSL are formed. The method for forming the word lines WL_0 to WL_N and the source selection lines SSL is the same as the method described above with reference to FIG. 2B.

Subsequently, a source line SL is formed. The source line SL may be formed in such a manner that the lower end of the source line SL is disposed in substantially the same height as the lower ends of the word lines WL_0 to WL_N and the source selection lines SSL. Here, unlike the first embodiment, the source line SL may not be coupled with a portion of the substrate 300 in the second embodiment of the present invention. The method for forming the source line SL is described in detail, hereafter.

For example, a trench (not shown) for defining a space where the source line SL is to be formed may be formed by selectively etching an insulation layer (not shown) between the source selection lines SSL. Here, the insulation layer (not shown) is etched to a depth exposing the sidewalls of all the channel layers 314. Subsequently, the source line SL may be formed by filling the trench with a conductive material.

Alternatively, the source line SL may be formed by forming a line-type trench (not shown), which is extended in the second direction and penetrates the channel structures 210 by selectively etching the insulation layer (not shown) between the source selection lines SSL and the channel structures 310 to a depth that exposes the sidewalls of all the channel layers 314, and by filling the trench (not shown) with a conductive material.

Referring to FIG. 3B, channel structures 310A with both ends shaped like a staircase are formed by etching the channel structures 310 of a region except a region where the word lines WL_0 to WL_N, the source selection lines SSL, and the source line SL are disposed. Since the etching method for forming the channel structures 310A having a staircase shape is well-known, further description thereof is not provided herein.

Subsequently, a first insulation layer 320 covering the resultant structure is formed. The first insulation layer 320 is selectively etched to form contact holes which expose the protruding ends of the channel layers 314. At the same time, contact holes exposing the source line SL are formed. Subsequently, channel contacts 330 coupled with the channel layers 314 and the first contact 335 coupled with the source line SL are formed by filling the contact holes with a conductive material.

Referring to FIG. 3C, a second insulation layer 340 is formed over the first insulation layer 320 including the channel contacts 330 and the first contact 335, and a conductive layer 350 for drain selection lines is formed over the second insulation layer 340. Here, the conductive layer 350 for drain selection lines is formed over the channel contacts 330 and has a shape of line extended in the second direction.

Subsequently, a third insulation layer 360 covering the conductive layer 350 for drain selection lines is formed.

Referring to FIG. 3D, contact holes which expose the channel contacts 330 are formed by selectively etching the third insulation layer 360, the conductive layer 350 for drain selection lines, and the second insulation layer 340, and at the same time, a contact hole exposing the first contact 335 is formed by selectively etching the third insulation layer 360 and the second insulation layer 340. Subsequently, a gate insulation layer 370 for drain selection transistors is formed on the sidewalls of contact holes that expose the channel contact 330, and the channels 380 for drain selection transistors are formed by filling the contact holes having the gate insulation layer 370 with a channel-forming layer, such as a semiconductor material. Also, a second contact 385 is formed by filling the contact holes exposing the first contact 335 with a conductive layer.

The etched conductive layer 350 for drain selection lines becomes drain selection lines 350A.

Referring to FIG. 3E, bit lines BL that are extended in the first direction and coupled with the channels 380 arranged in the first direction, and a pad PD coupled with the second contact 385 and disposed between the bit lines BL by being spaced from the bit lines are formed by depositing a conductive layer over the third insulation layer 360 and patterning the conductive layer.

Subsequently, a fourth insulation layer 390 covering the bit line BL and the pad PD is formed, and then contact holes exposing the pad PD are formed by selectively etching the fourth insulation layer 390. Subsequently, a third contact 395 is formed by filling the contact holes with a conductive material.

Subsequently, metal lines M coupled with the third contact 395 are formed by depositing a conductive layer over the fourth insulation layer 390 and patterning the conductive layer.

Figure 4A:
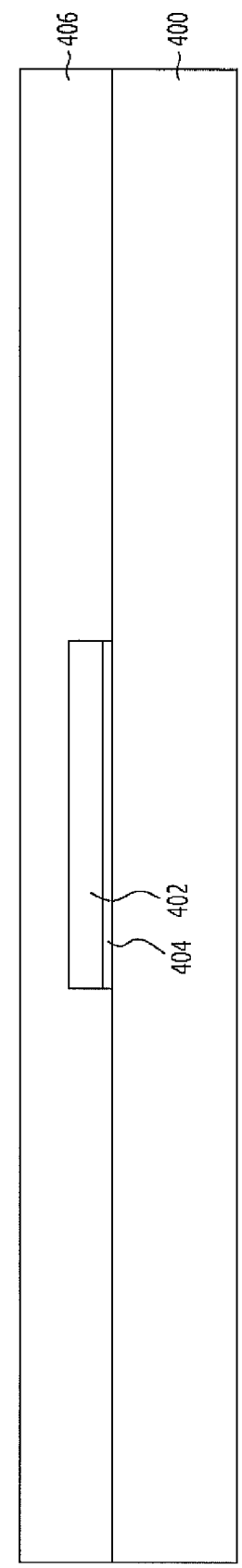
FIGS. 4A to 4E are cross-sectional views illustrating a non-volatile memory device and a fabrication method thereof in accordance with a third embodiment of the present invention.
Figure 4B:
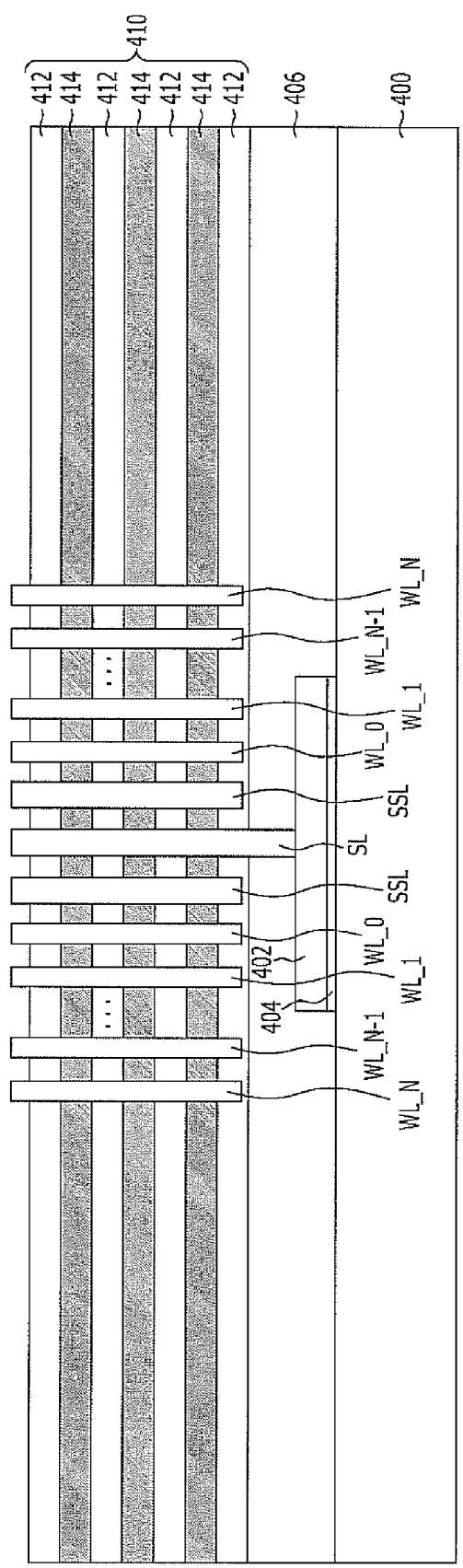
Figure 4C:
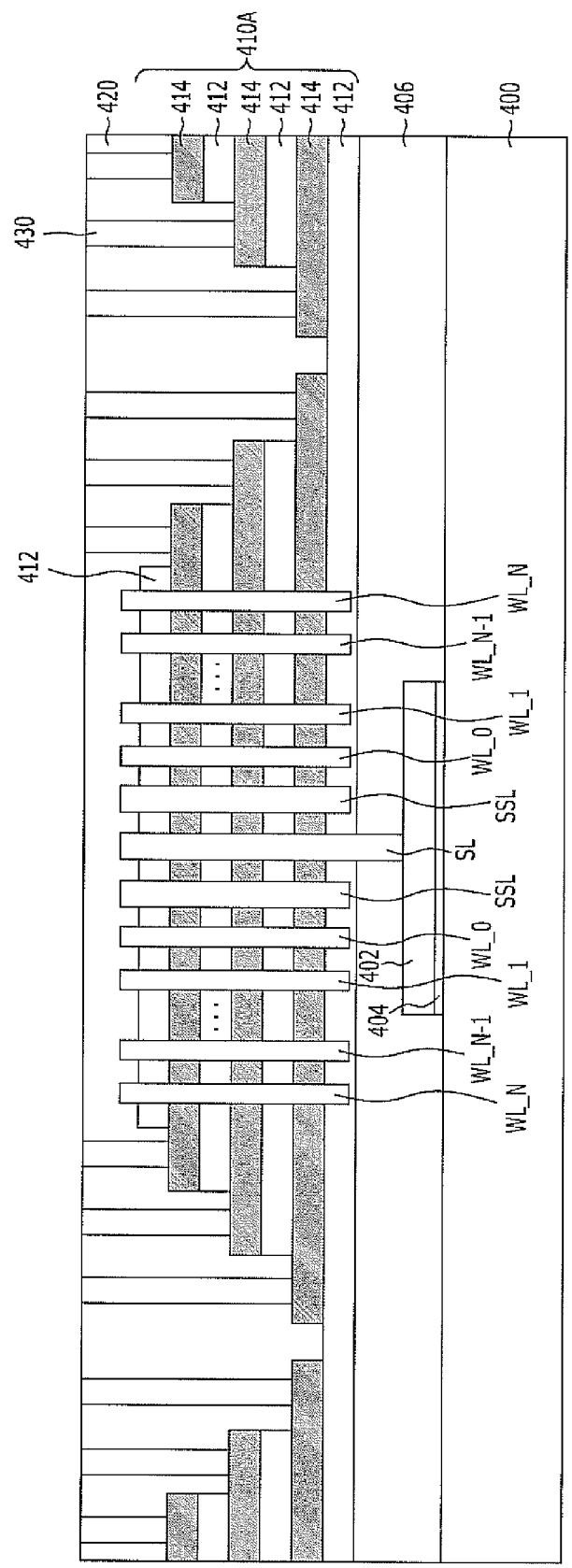
Figure 4D:
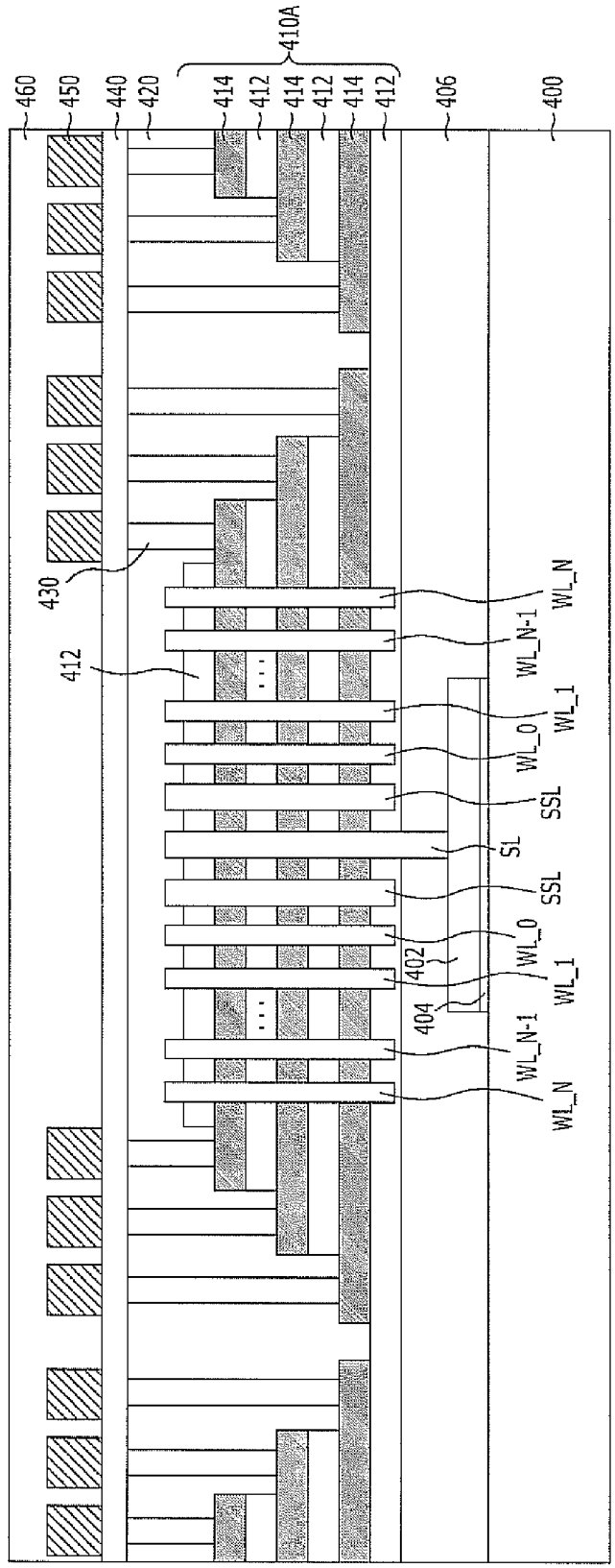
Figure 4E:
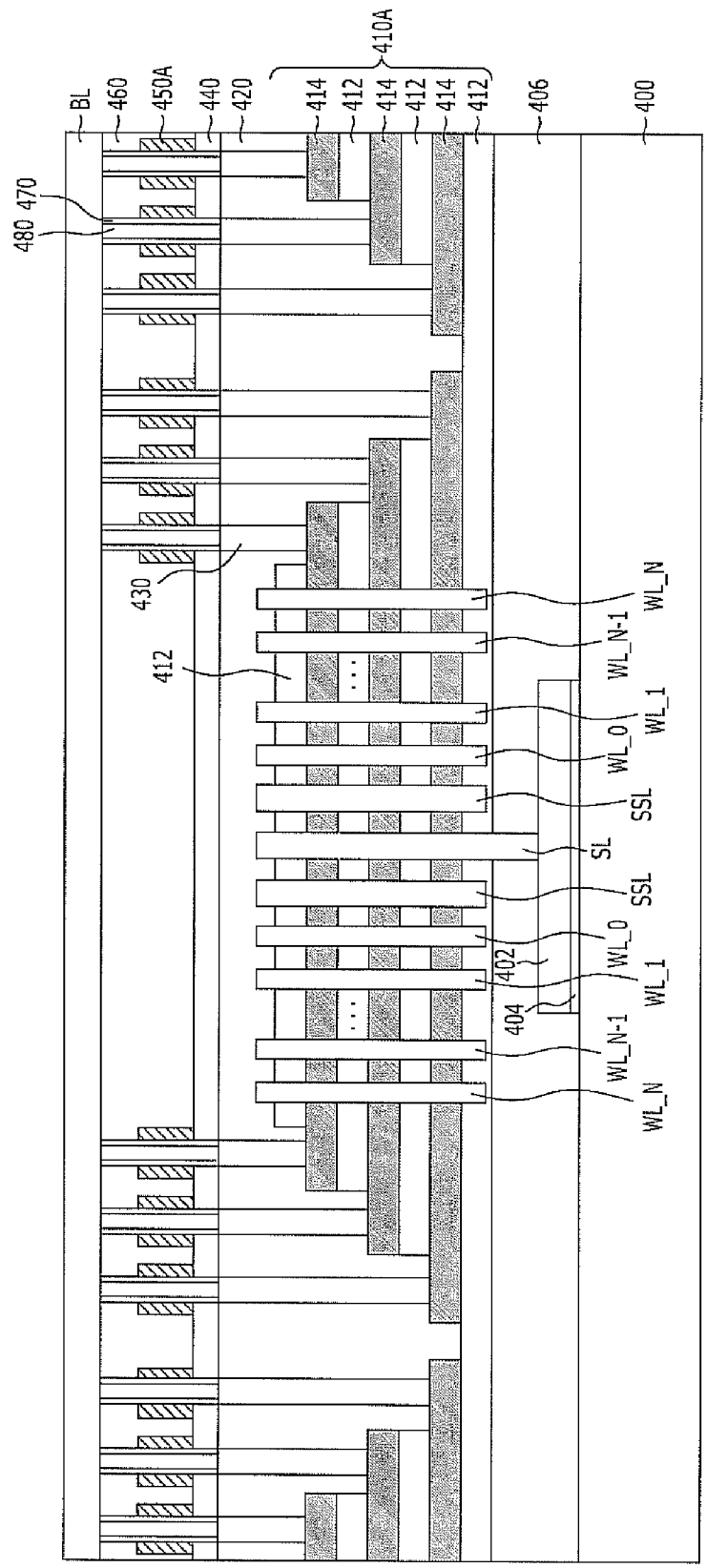

FIGS. 4A to 4E are cross-sectional views illustrating a non-volatile memory device and a fabrication method thereof in accordance with a third embodiment of the present invention. Particularly, FIG. 4E shows the non-volatile memory device in accordance with the third embodiment of the present invention, and FIGS. 4A to 4D illustrate intermediate processes for fabricating the non-volatile memory device shown in FIG. 4E. The drawings show cross-sections taken along a line A-A' in FIG. 1. Hereafter, description as to the same constituent elements as those of the non-volatile memory device shown in FIG. 1 is omitted or provided briefly, and the description is provided based on the modifications from the non-volatile memory device of FIG. 1.

First, the non-volatile memory device is described.

Referring to FIG. 4E, the non-volatile memory device in accordance with the third embodiment of the present invention includes a substrate 400, a peripheral circuit gate 402, which is a peripheral circuit device disposed over the substrate 400, a fourth insulation layer 406 covering the peripheral circuit gate 402, channel structures 410A, a source line SL, source selection lines SSL, and a plurality of word lines WL_0 to WL_N. Each channel structure 410A is extended in a first direction and includes inter-layer dielectric layers 412 and channel layers 414 that are stacked alternately over the fourth insulation layer 406. The source line SL is extended in a second direction and contacts the sidewalls of the channel structures 410A, and the lower end of the source line SL is coupled with the peripheral circuit gate 402. The source selection lines SSL are symmetrically disposed on both sides of the source line SL and extended in the second direction while contacting the sidewalls of the channel structures 410A with a gate insulation layer 140 (see FIG. 1) between them. The word lines WL_0 to WL_N are symmetrically disposed on both sides of the source selection lines SSL and extended in the second direction while contacting the sidewalls of the channel structures 410A with a memory layer 130 (see FIG. 1) between them.

In the three-dimensional non-volatile memory device in accordance with the embodiment of the present invention, since channel layers 414 are not formed in the substrate 400, peripheral regions may be disposed between the substrate 400 and regions where memory cells are to be disposed. Here, diverse peripheral circuit devices may be formed in the space between the substrate 400 and the channel structures 410A. Peripheral regions and the memory cell regions may be isolated by an insulation material, such as, the fourth insulation layer 406.

In this embodiment, a peripheral circuit gate 402 formed of a low-resistance material, such as metal, and insulated from the substrate 400 by a gate insulation layer 404 may be disposed over the substrate 400. In particular, the peripheral circuit gate 402 may be disposed under the source line SL.

The fourth insulation layer 406 is disposed over the substrate 400 to cover the peripheral circuit gate 402.

The channel structures 410A may be substantially the same as the channel structures C shown in FIG. 1, except that they are disposed over the fourth insulation layer 406.

The source line SL is similar to the source line SL shown in FIG. 1 but the lower end of the source line SL contacts the peripheral circuit gate 402 disposed over the substrate 400. Here, the source line SL may have a portion disposed over the channel structures 410A and extended in the second direction and a portion vertically protruding down from the extended portion to fill the space between the channel structures 410A, which are arranged in the second direction by being spaced from each other. Here, the protruding portion has a height sufficient for contacting the peripheral circuit gate 402 through the fourth insulation layer 406. Alternatively, the source line SL may penetrate the channel structures 410A and the fourth insulation layer 406 and be extended in the second direction.

The word lines WL_0 to WL_N and the source selection lines SSL may have substantially the same shape as the word lines WL_0 to WL_N and the source selection lines SSL that are shown in FIG. 1.

Furthermore, the non-volatile memory device in accordance with the third embodiment of the present invention may further include channel contacts 430, drain selection lines 450A, channels 480 for drain selection transistors, and bit lines BL, which are substantially the same elements as those shown in FIG. 1.

Reference numerals '420', '440' and '460' which are not described above denote a first insulation layer, a second insulation layer, and a third insulation layer, respectively.

Hereafter, a method for fabricating the non-volatile memory device is described.

Referring to FIG. 4A, a peripheral circuit device is formed over the substrate 400. In this embodiment, the peripheral circuit gate 402 insulated from the substrate 400 by the gate insulation layer 404 may be formed by depositing a gate insulation layer and a conductive layer for gates and patterning the gate insulation layer and the conductive layer for gates.

Subsequently, the fourth insulation layer 406 covering the peripheral circuit gate 402 is formed.

Subsequently, a plurality of channel structures 410 are formed to be extended in the first direction and be arranged in parallel to each other in the second direction with a desired spacing between them by alternately forming inter-layer insulation layers 412 and channel layers 414 over the fourth insulation layer 406 and patterning the inter-layer insulation layers 412 and the channel layers 414.

Subsequently, a plurality of word lines WL_0 to WL_N and source selection lines SSL are formed. The method for forming the word lines WL_0 to WL_N and the source selection lines SSL is the same as is the method described above with reference to FIG. 2B.

Subsequently, a source line SL is formed. The source line SL may be formed in such a manner that the lower end of the source line SL is disposed to contact the peripheral circuit gate 402. The method for forming the source line SL is described in detail, hereafter.

For example, a trench (not shown) for defining a space where the source line SL is to be formed is formed by selectively etching an insulation layer (not shown) between the source selection lines SSL. Here, the insulation layer (not shown) is etched to a desired depth of the fourth insulation layer 406 so that the sidewalls of all the channel layers 414 and the peripheral circuit gate 402 are exposed. Subsequently, the trench (not shown) is filled with a conductive material to form the source line SL.

Alternatively, the source line SL may be formed by forming a line-type trench (not shown), which is extended in the second direction and penetrates the channel structures 410 by selectively etching the insulation layer (not shown) between the source selection lines SSL, the channel structures 410, and the fourth insulation layer 406 to a depth that exposes the peripheral circuit gate 402, and by filling the trench (not shown) with a conductive material.

Subsequent processes, that is, the processes illustrated in FIGS. 4C to 4E, are substantially the same as the processes described above with reference to FIGS. 2C to 2E, further description thereof is omitted herein.

According to an embodiment of the present invention, a non-volatile memory device may decrease the resistance of a source line while increasing the integration degree by stacking a plurality of memory cells in a vertical direction.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
    a substrate including a resistor layer having a resistance lower than that of a source line;
    channel structures including a plurality of inter-layer dielectric layers and a plurality of channel layers that are alternately stacked over the substrate; and
    the source line configured to contact sidewalls of the channel layers, wherein a lower end of the source line contacts the resistor layer.

2. The non-volatile memory device of claim 1, wherein the resistor layer comprises a region doped with an impurity in the substrate.

3. The non-volatile memory device of claim 1, wherein the resistor layer is formed of a metal layer, a metal silicide layer, or a semiconductor layer doped with an impurity and is disposed over the substrate.

4. The non-volatile memory device of claim 1, wherein the resistor layer is formed of a peripheral circuit gate disposed over the substrate.

5. The non-volatile memory device of claim 1, wherein the substrate is isolated from the resistor layer by an insulation layer.

6. The non-volatile memory device of claim 1, wherein the source line comprises a first portion disposed over the channel structures and extended to cross the channel structures and a second portion vertically extending from the first portion to contact sidewalls of the channel layers.

7. The non-volatile memory device of claim 1, wherein the source line penetrates the channel structures and contacts the sidewalls of the channel layers in a direction that crosses a direction that the channel structures are extended.

8. A method for fabricating a non-volatile memory device, comprising:
    providing a substrate including a resistor layer having a resistance lower than that of a source line;
    forming channel structures comprising a plurality of inter-layer dielectric layers and a plurality of channel layers that are alternately stacked over the substrate; and
    forming the source line contacting sidewalls of the channel layers, wherein a lower end of the source line contacts the resistor layer.

9. The method of claim 8, wherein the providing of the substrate including the resistor layer comprises:
doping the substrate with an impurity for the resistor layer.

10. The method of claim 8, wherein the providing of the substrate including the resistor layer comprises:
forming a metal layer, a metal silicide layer, or a semiconductor layer doped with an impurity for the resistor layer, wherein the resistor layer is formed over the substrate.

11. The method of claim 8, wherein the providing of the substrate including the resistor layer comprises:
forming a peripheral circuit gate for the resistor layer over the substrate.

12. The method of claim 8, wherein in the providing of the substrate including the resistor layer having the lower resistance than the source line,
the substrate is isolated from the resistor layer by an insulation layer.

13. A non-volatile memory device, comprising:
channel structures including a plurality of inter-layer dielectric layers that are alternately stacked with a plurality of channel layers over a substrate;
a source line arranged to contact sidewalls of the channel layers;
an insulation layer arranged to cover the channel structures;
a metal line disposed over the insulation layer; and
a contact unit configured to couple the source line with the metal line through the insulation layer.

14. The non-volatile memory device of claim 13, wherein the insulation layer comprises a lower insulation layer and an upper insulation layer, and
the contact unit comprises a first contact coupled with the source line through the lower insulation layer, a pad disposed over the lower insulation layer to be coupled with the first contact, and a second contact coupled with the pad through the upper insulation layer.

15. The non-volatile memory device of claim 14, wherein the pad is disposed in the same layer as bit lines but spaced apart from the bit lines.

16. The non-volatile memory device of claim 15, further comprising:
a plurality of channel contacts disposed inside the lower insulation layer and coupled with ends of the channel layers, channels for drain selection transistors disposed over the channel contacts, and a gate insulation layer and drain selection lines surrounding the channels for drain selection transistors; and
the bit lines disposed over the lower insulation layer and coupled with the channels for drain selection transistors.

17. A method for fabricating a non-volatile memory device, comprising:
forming channel structures including a plurality of inter-layer dielectric layers that are alternately stacked with a plurality of channel layers over a substrate;
forming a source line contacting sidewalls of the channel layers;
forming an insulation layer over the channel structures and the source line;
forming a contact unit coupled with the source line through the insulation layer; and
forming a metal line coupled with the contact unit over the insulation layer.

18. The method of claim 17, further comprising:
forming a lower insulation layer over the channel structures and the source line before the forming of the metal line;
forming a first contact coupled with the source line through the lower insulation layer;
forming a pad coupled with the first contact over the lower insulation layer;
forming an upper insulation layer over the lower insulation layer comprising the pad; and
forming a second contact coupling the pad with the metal line through the upper insulation layer.

19. The method of claim 18, further comprising:
forming a plurality of channel contacts disposed inside the lower insulation layer and coupled with ends of the channel layers;
forming channels for drain selection transistors disposed in the upper portions of the channel contacts;
forming a gate insulation layer and drain selection lines surrounding the channels for drain selection transistors; and
forming the bit lines disposed over the lower insulation layer and coupled with the channels for drain selection transistors.

20. The method of claim 19, wherein the forming of the pad and the forming of the bit lines are performed simultaneously.

* * * * *